(12) United States Patent
Han et al.

(10) Patent No.: US 12,277,893 B2
(45) Date of Patent: Apr. 15, 2025

(54) SHIFT REGISTER AND DRIVING METHOD THEREOF, GATE DRIVER AND DISPLAY DEVICE

(71) Applicant: BOE TECHNOLOGY GROUP CO., LTD., Beijing (CN)

(72) Inventors: Seungwoo Han, Beijing (CN); Haoliang Zheng, Beijing (CN); Minghua Xuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/620,206

(22) PCT Filed: Dec. 23, 2020

(86) PCT No.: PCT/CN2020/138615
§ 371 (c)(1),
(2) Date: Dec. 17, 2021

(87) PCT Pub. No.: WO2022/133800
PCT Pub. Date: Jun. 30, 2022

(65) Prior Publication Data
US 2022/0406244 A1    Dec. 22, 2022

(51) Int. Cl.
*G09G 3/20* (2006.01)
*G09G 3/32* (2016.01)
(Continued)

(52) U.S. Cl.
CPC ............... *G09G 3/32* (2013.01); *G11C 19/28* (2013.01); *G09G 2300/0426* (2013.01);
(Continued)

(58) Field of Classification Search
CPC ............. G09G 3/32; G09G 2300/0426; G09G 2310/0267–0286; G09G 2330/02; G11C 19/28
See application file for complete search history.

(56) References Cited

U.S. PATENT DOCUMENTS

2011/0274236 A1    11/2011  Tobita
2016/0086562 A1*   3/2016   Tan ...................... G11C 19/184
                                                              345/215
(Continued)

FOREIGN PATENT DOCUMENTS

CN    103295511 A  *  9/2013  ............... G09G 3/20
CN    106601177 A     4/2017
(Continued)

OTHER PUBLICATIONS

European Patent Office, Extended European Search Report, App. EP20966378.0, issued May 3, 2023, Aug. 19, 2023.

*Primary Examiner* — Lin Li
(74) *Attorney, Agent, or Firm* — HOUTTEMAN LAW LLC

(57) ABSTRACT

A shift register includes: an input circuit for transmitting an input signal to a first node under control of a first clock signal, and for transmitting the first clock signal to the second node under control of a level of the first node; a control circuit for transmitting a second power supply signal to the first node under control of a level of the second node and a second clock signal, for transmitting the second clock signal to the third node under control of a level of the fourth node and/or the first; a pull-down control circuit; and an output circuit for transmitting the fourth power supply signal or the third power supply signal to the signal output terminal. The pull-down control circuit controls a level of the fifth node regardless of the first clock signal.

15 Claims, 4 Drawing Sheets

(51) Int. Cl.
*G11C 19/18* (2006.01)
*G11C 19/28* (2006.01)

(52) U.S. Cl.
CPC ............ *G09G 2310/0267* (2013.01); *G09G 2310/0286* (2013.01); *G09G 2330/02* (2013.01)

(56) References Cited

U.S. PATENT DOCUMENTS

| | | | | |
|---|---|---|---|---|
| 2016/0189796 A1* | 6/2016 | Wu | ............ | G09G 5/003 |
| | | | | 377/64 |
| 2016/0329015 A1* | 11/2016 | Ji | ............ | G09G 3/32 |
| 2019/0096352 A1* | 3/2019 | Xue | ............ | G11C 19/28 |
| 2020/0265877 A1* | 8/2020 | Zheng | ............ | G11C 19/28 |

FOREIGN PATENT DOCUMENTS

| | | | | | |
|---|---|---|---|---|---|
| CN | 106847221 A | | 6/2017 | | |
| CN | 107784977 A | | 3/2018 | | |
| CN | 108389545 A | * | 8/2018 | ............ | G09G 3/20 |
| CN | 109389545 A | * | 8/2018 | ............ | G09G 3/20 |
| CN | 109584780 A | | 4/2019 | | |
| CN | 109872699 A | * | 6/2019 | ............ | G09G 3/36 |
| CN | 110189680 A | * | 8/2019 | ............ | G09G 3/20 |
| CN | 110189694 A | | 8/2019 | | |
| CN | 110313028 A | * | 10/2019 | ............ | G09G 3/20 |
| CN | 110534051 A | | 12/2019 | | |
| CN | 110767665 A | | 2/2020 | | |
| CN | 112419960 A | * | 2/2021 | ............ | G09G 3/20 |
| WO | WO 2020228017 A1 | | 11/2020 | | |

* cited by examiner

SHIFT REGISTER AND DRIVING METHOD THEREOF, GATE DRIVER AND DISPLAY DEVICE

TECHNICAL FIELD

The application relates to the field of display technology, in particular to a shift register, a driving method thereof, a gate driver and a display device.

BACKGROUND

In a display panel using self-light emitting devices such as light emitting diodes (LEDs), the light emitting efficiency of the self-light emitting devices may decrease as the current density decreases, and when the current flowing in the self-light emitting devices reaches a certain amount or less, a phenomenon of non-uniformity in luminance may occur, thereby affecting the display effect of the display panel at low grayscales. Therefore, it is necessary to control the light emitting time using a pulse width modulation (PWM) signal to realize a low grayscale display.

However, when the PWM signal with high frequency is used to control the LED emitting time in the display panel, the shift register circuit used by the existing gate driver has drawbacks.

SUMMARY

In one aspect, the present disclosure provides a shift register, including: an input circuit coupled to a signal input terminal, a first clock terminal, a first power supply terminal, a first node and a second node, and configured to transmit an input signal provided from the signal input terminal to the first node under control of a first clock signal input from the first clock terminal, to transmit a first power supply signal provided from the first power supply terminal to the second node under control of the first clock signal, and to transmit the first clock signal to the second node under control of a level at the first node; a control circuit coupled to the first node, the second node, a second power supply terminal, a second clock terminal, a third node and a fourth node, and configured to transmit a second power supply signal provided from the second power supply terminal to the first node under control of a level at the second node and a second clock signal input from the second clock terminal, to transmit the second clock signal to the third node under control of at least one of a level at the fourth node and the level at the first node, and to transmit the second power supply signal to the third node under control of a level at the second node; a pull-down control circuit coupled to the second clock terminal, the first power supply terminal, the second power supply terminal, the third node and a fifth node; and an output circuit coupled to the third node, a third power supply terminal, a fourth power supply terminal, the fifth node and a signal output terminal, and configured to transmit a fourth power supply signal provided from the fourth power supply terminal to the signal output terminal under control of a level at the third node, and to transmit a third power supply signal provided from the third power supply terminal to the signal output terminal under control of a level at the fifth node. The pull-down control circuit is configured to control the level at the fifth node regardless of the first clock signal.

In some embodiments, the pull-down control circuit is configured to provide a current path between the second power supply terminal and the fifth node under control of the level at the third node, to provide a current path between the first power supply terminal and the fifth node under control of the first power supply signal, and to maintain a voltage difference between the fifth node and the second clock terminal in a case where the fifth node is floating. A capability of the pull-down control circuit to drive the fifth node through the current path between the second power supply terminal and the fifth node is greater than a capability of the pull-down control circuit to drive the fifth node through the current path between the first power supply terminal and the fifth node.

In some embodiments, the pull-down control circuit includes: a first pull-down control transistor, a second pull-down control transistor, and a pull-down control capacitor. The first pull-down control transistor has a control electrode coupled to the third node, a first electrode coupled to the second power supply terminal, and a second electrode coupled to the fifth node. The second pull-down control transistor has a control electrode coupled to the first power supply terminal, a first electrode coupled to the fifth node, and a second electrode coupled to the first power supply terminal. The pull-down control capacitor has a first electrode coupled to the fifth node, and a second electrode coupled to the second clock terminal.

In some embodiments, the first pull-down control transistor has a larger width-to-length ratio than that of the second pull-down control transistor.

In some embodiments, the control circuit is configured to transmit the second clock signal to the third node under control of a level at the fourth node. The shift register further includes: a leakage prevention circuit coupled to the first node, the first power supply terminal and the fourth node, and configured to control an electrical connection between the first node and the fourth node under control of the first power supply signal.

In some embodiments, the leakage prevention circuit includes a leakage prevention transistor having a control electrode coupled to the first power supply terminal, a first electrode coupled to the first node, and a second electrode coupled to the fourth node.

In some embodiments, the control circuit is configured to transmit the second clock signal to the third node under control of the level at the fourth node, and includes: a first control sub-circuit coupled to the second node, the second clock terminal, the second power supply terminal and the first node, and configured to transmit the second power supply signal to the first node under control of the level at the second node and the second clock signal; a second control sub-circuit coupled to the fourth node, the second clock terminal and the third node, and configured to transmit the second clock signal to the third node under control of the level at the fourth node, and to maintain a voltage difference between the fourth node and the third node in a case where the fourth node is floating; and a third control sub-circuit coupled to the second node, the second power supply terminal and the third node, and configured to transmit the second power supply signal to the third node under control of the level at the second node, and to maintain a voltage difference between the second node and the second power supply terminal in a case where the second node is floating.

In some embodiments, the first control sub-circuit includes a first control transistor and a second control transistor. The first control transistor has a control electrode coupled to the second node, a first electrode coupled to the second power supply terminal, and a second electrode coupled to a first electrode of the second control transistor. A control electrode of the second control transistor is coupled to the second clock terminal, and a second electrode of the second control transistor is coupled to the first node.

In some embodiments, the second control sub-circuit includes a third control transistor and a first control capacitor. The third control transistor has a control electrode coupled to the fourth node, a first electrode coupled to the third node, and a second electrode coupled to the second clock terminal. The first control capacitor has a first electrode coupled to the fourth node and a second electrode coupled to the third node.

In some embodiments, the third control sub-circuit includes a fourth control transistor and a second control capacitor. The fourth control transistor has a control electrode coupled to the second node, a first electrode coupled to the second power supply terminal, and a second electrode coupled to the third node. The first control capacitor has a first electrode coupled to the second node, and a second electrode coupled to the second power supply terminal.

In some embodiments, the input circuit includes: a first input sub-circuit coupled to the signal input terminal, the first clock terminal and the first node, and configured to transmit the input signal to the first node under control of the first clock signal; and a second input sub-circuit coupled to the first power supply terminal, the first clock terminal, the first node and the second node, and configured to transmit the first power supply signal to the second node under control of the first clock signal, and to transmit the first clock signal to the second node under control of the level at the first node.

In some embodiments, the first input sub-circuit includes a first input transistor having a control electrode coupled to the first clock terminal, a first electrode coupled to the signal input terminal, and a second electrode coupled to the first node.

In some embodiments, the second input sub-circuit includes a second input transistor and a third input transistor. The second input transistor has a control electrode coupled to the first node, a first electrode coupled to the second node, and a second electrode coupled to the first clock terminal. The third input transistor has a control electrode coupled to the first clock terminal, a first electrode coupled to the first power supply terminal, and a second electrode coupled to the second node.

In some embodiments, the output circuit includes: a first output sub-circuit coupled to the third node, the fourth power supply terminal and the signal output terminal, and configured to transmit the fourth power supply signal to the signal output terminal under control of the level at the third node; and a second output sub-circuit coupled to the fifth node, the third power supply terminal and the signal output terminal, and configured to transmit the third power supply signal to the signal output terminal under control of the level at the fifth node.

In some embodiments, the first output sub-circuit includes a first output transistor having a control electrode coupled to the third node, a first electrode coupled to the fourth power supply terminal, and a second electrode coupled to the signal output terminal.

In some embodiments, the second output sub-circuit includes a second output transistor having a control electrode coupled to the fifth node, a first electrode coupled to the signal output terminal, and a second electrode coupled to the third power supply terminal.

In another aspect, the present disclosure provides a gate driver including a plurality of cascaded shift registers, each of the shift registers being the shift register described above.

In another aspect, the present disclosure provides a display device including the gate driver described above.

In another aspect, the present disclosure provides a method for driving shift register, the shift register being the above shift register. The method includes: in a first period, applying an input signal having an active level to the signal input terminal, applying a first clock signal having an active level to the first clock terminal, and applying a second clock signal having an inactive level to the second clock terminal, such that a signal output from the output terminal of the shift register has a first level; in a second period, applying the input signal having an inactive level to the signal input terminal, applying the first clock signal having an inactive level to the first clock terminal, and applying the second clock signal having an active level to the second clock terminal, such that the signal output from the output terminal of the shift register has a second level different from the first level; in a third period, applying the input signal having an inactive level to the signal input terminal, applying the first clock signal having an inactive level to the first clock terminal, and applying the second clock signal having an inactive level to the second clock terminal, such that the signal output from the output terminal of the shift register has the first level; in a fourth period, applying the input signal having an inactive level to the signal input terminal, applying the first clock signal having an active level to the first clock terminal, and applying the second clock signal having an inactive level to the second clock terminal, such that the signal output from the output terminal of the shift register has the first level; and in a fifth period, applying the input signal having an inactive level to the signal input terminal, applying the first clock signal having an inactive level to the first clock terminal, and applying the second clock signal having an active level to the second clock terminal, such that a signal output from the output terminal of the shift register has the first level. The first period, the second period, the third period, the fourth period, and the fifth period are periods that are sequential in time. During the first through fifth periods, the first power supply signal having a constant inactive level is applied to the first power supply terminal, the second power supply signal having a constant active level is applied to the second power supply terminal, the third power supply signal having a constant first level is applied to the third power supply terminal, and the fourth power supply signal having a constant second level is applied to the fourth power supply terminal.

BRIEF DESCRIPTION OF DRAWINGS

The accompanying drawings, which are included to provide a further understanding of the present disclosure and constitute a part of this specification, serve to explain the present disclosure together with the following embodiments, but do not limit the present disclosure.

DETAIL DESCRIPTION OF EMBODIMENTS

Figure 1A:
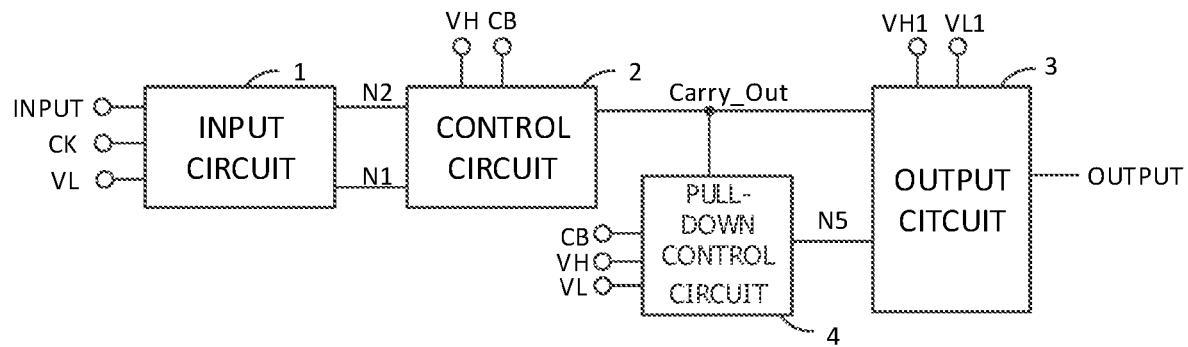
FIGS. 1A and 1B are block diagrams of a shift register according to some embodiments of the present disclosure.

In order to make those skilled in the art to better understand the technical solutions of the present disclosure, the present disclosure will be further described in detail below with reference to the accompanying drawings and the specific embodiments.

Herein, the term "active level" refers to a voltage capable of controlling a corresponding transistor to be turned on, and the term "inactive level" refers to a voltage capable of controlling a corresponding transistor to be turned off. For example, when the transistor is an N-type transistor, the active level may refer to a high level and the inactive level may refer to a low level. For example, when the transistor is a P-type transistor, the active level may refer to a low level and the inactive level may refer to a high level.

Herein, for a transistor element, a control electrode thereof refers to a gate electrode of the transistor, one of a first electrode and a second electrode thereof is a source electrode of the transistor, and the other is a drain electrode of the transistor.

Herein, the circuit configuration and the operation principle of the shift register in the embodiments of the present disclosure are explained by taking a case where respective transistors are P-type transistors as an example. However, the present disclosure is not limited thereto, and those skilled in the art may implement the circuit in the embodiments of the present disclosure by using one or more N-type transistors, and adjusting the levels of various signals such as an input signal, a control signal and/or a clock signal accordingly, and these circuit implementations and the adjustment of signal levels also fall within the scope of protection of the present disclosure.

When an element is referred to herein as being "connected" or "coupled" to another element(s), it can be directly connected or coupled to the other element(s) or intervening elements may be present.

In a self-light emitting device display technology such as an active matrix organic light emitting diode (AMOLED) display and a micro light emitting diode (MicroLED) display, it usually requires two kinds of gate driver on array (GOA), one is a GOA circuit (referred to as Gate GOA) that controls a gate line connected to each row of pixels to be turned on or turned off, and the other is a light emission control GOA circuit (referred to as Emission GOA) that controls each row of pixels to emit light. The Emission GOA is generally formed by cascading a plurality of shift registers to transfer the light emission control signal for the pixel rows row by row.

In order to achieve a better display effect for low grayscale, the light emission is usually controlled by combining pulse width modulation and pulse amplitude modulation. In controlling the light emission time of the self-light emitting device using the pulse width modulation signal, in order to reduce flicker, the light emission time of the LED may be controlled using a high frequency PWM signal (hereinafter, referred to as an Hf signal). In order to minimize signal interference, other signals (e.g., clock signals, etc.) need to be always set to an inactive level during the input period of the Hf signal. However, the shift register is generally designed to be normally output based on a pair of clock signals that are continuously operated (for example, two clock signals alternately having an active level), and if the pair of clock signals are both of an inactive level in the Hf signal input period, the shift register cannot output a desired signal. When such a shift register is employed to constitute an Emission GOA, the pulse width of the emission control signal is different for different pixel rows, so that the emission brightness is different for different pixel rows, which affects the display quality.

For example, in one operation cycle of the Emission GOA, a desired output waveform of each shift register has an inactive level pulse in the output period and an active level in other periods, and the output periods of respective stages of the pluralitly of shift registers are sequential in time and do not overlap with each other. In the Hf signal input period, the existing shift register cannot maintain an active level as desired. Particularly, in a case where the Hf signal input period immediately follows the output period of the shift register, the output waveform of the shift register in the Hf signal input period is still the above-mentioned inactive-level pulse of the output period, not the desired active level.

To this end, the present disclosure provides, inter alia, a shift register and a driving method thereof, a gate driver, and a display device, that substantially obviate one or more of the problems due to limitations and disadvantages of the related art.

In one aspect, the present disclosure provides a shift register including an input circuit, a control circuit, an output circuit, and a pull-down control circuit, and the pull-down control circuit is configured to control a level at the fifth node regardless of a first clock signal.

Figure 1B:
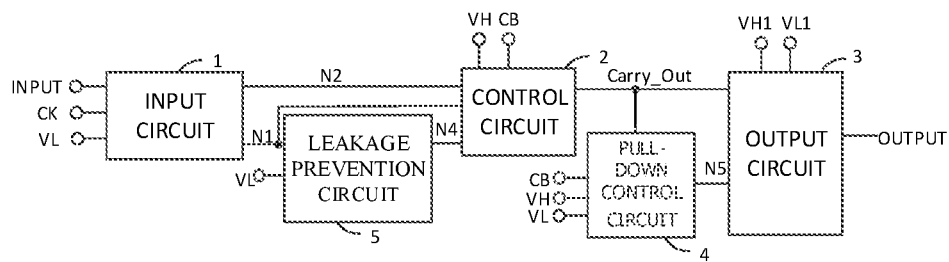

FIGS. 1A and 1B illustrate block diagrams of a shift register according to embodiments of the present disclosure.

Referring to FIG. 1A, the shift register includes an input circuit 1, a control circuit 2, an output circuit 3, and a pull-down control circuit 4.

The input circuit 1 is connected to the signal input terminal INPUT, the first clock terminal CK, the first power supply terminal VL, the first node N1 and the second node N2, and is configured to transmit an input signal provided from the signal input terminal INPUT to the first node N1 under control of a first clock signal input from the first clock terminal CK, to transmit a first power supply signal provided from the first power supply terminal VL to the second node N2 under control of the first clock signal, and to transmit the first clock signal to the second node N2 under control of a level at the first node N1.

The control circuit 2 is connected to the first node N1, the second node N2, the second power supply terminal VH, the second clock terminal CB and the third node Carry_Out, and is configured to transmit the second power supply signal provided from the second power supply terminal VH to the first node N1 under control of a level at the second node N2 and the second clock signal input from the second clock terminal CB, to transmit the second clock signal to the third node Carry_Out under control of the level at the first node N1, and to transmit the second power supply signal to the third node Carry_Out under control of the level at the second node N2.

The output circuit 3 is connected to the third node Carry_Out, the third power supply terminal VL1, the fourth power supply terminal VH1, the fifth node N5 and the signal output terminal OUTPUT, and is configured to transmit the fourth power supply signal provided from the fourth power supply terminal VH1 to the signal output terminal OUTPUT under control of the level at the third node Carry_Out, and to transmit the third power supply signal provided from the third power supply terminal VL1 to the signal output terminal OUTPUT under control of the level at the fifth node N5.

The pull-down control circuit 4 is connected to the second clock terminal CB, the first power supply terminal VL, the second power supply terminal VH, the third node Carry_Out and the fifth node N5, and is configured to control the level of the fifth node N5 regardless of the first clock signal CK.

In some embodiments, the pull-down control circuit 4 is configured to provide a current path between the second power supply terminal VH and the fifth node N5 under the control of the level at the third node Carry_Out, the pull-down control circuit 4 is further configured to provide a current path between the first power supply terminal VL and the fifth node N5 under the control of the first power supply signal, and to maintain a voltage difference between the fifth node N5 and the second clock terminal CB when the fifth node N5 is floating. The capability of the pull-down control circuit 4 to drive the fifth node N5 through the current path between the second power supply terminal VH and the fifth node N5 is greater than the capability of the pull-down control circuit 4 to drive the fifth node N5 through the current path between the first power supply terminal VL and the fifth node N5.

For example, in the case where the inactive level is a high level, the active level is a low level, and the corresponding transistor is a P-type transistor, the pull-down control circuit 4 charges the fifth node N5 under the control of the level at the third node Carry_Out, and discharges the fifth node N5 under the control of the first power supply signal VL, and the pull-down control circuit 4 charges the fifth node N5 at a speed faster than that of discharging the fifth node N5.

The first power supply signal provided from the first power supply terminal VL may have a constant active level, and the second power supply signal provided from the second power supply terminal VH may have a constant inactive level. For example, when the active level is a low level and the inactive level is a high level, the first power supply signal is a low-level power supply signal, and the second power supply signal is a high-level power supply signal.

Specifically, it is necessary to combine the function of the circuit to which the output terminal of the shift register is connected, e.g., the pixel driving circuit in the display panel, and the characteristics of the electronic elements in the circuit including transistors, and it is necessary to design the third power supply signal provided from the third power supply terminal VL1 to have a constant active level and the fourth power supply signal provided from the fourth power supply terminal VH1 to have a constant inactive level according to the operation timing of the pixel driving circuit and the conductivity type of the transistors. That is, whether the active level of the third power supply signal is a high level or a low level and whether the inactive level of the fourth power supply signal is a high level or a low level are determined according to a function of a circuit to which the output terminal of the shift register is connected and the characteristics of electronic elements in the circuit. For example, when the output terminal of the shift register is used to provide a turning-on signal to the P-type transistor in the pixel driving circuit, the third power supply signal is a low-level power supply signal, and the fourth power supply signal is a high-level power supply signal.

In some embodiments, the third power supply terminal VL1 and the first power supply terminal VL may be one and the same power supply terminal or may be electrically connected to each other, and the fourth power supply terminal VH1 and the second power supply terminal VH may be one and the same power supply terminal or may be electrically connected to each other. In this case, the transistors constituting the shift register and the transistors in the circuit to which the output terminal of the shift register is connected have the same conductivity type.

FIG. 1B shows another block diagram of a shift register according to an embodiment of the disclosure. The shift register shown in FIG. 1B is different from the shift register shown in FIG. 1A in that the shift register shown in FIG. 1B further includes a leakage prevention circuit 5, and the control circuit 2 transmits the second clock signal to the third node Carry_Out under the control of the level at the fourth node N4. Other components of the shift register are the same as those described with reference to FIG. 1A, and a repetitive description thereof is omitted.

Referring to FIG. 1B, the leakage prevention circuit 5 is connected to the first node N1, the first power supply terminal VL, and the fourth node N4, and is configured to control an electrical connection between the first node N1 and the fourth node N4 under the control of the first power supply signal. The leakage prevention circuit 5 can reduce leakage of components associated with the leakage prevention circuit 5 in the input circuit 1. The control circuit 2 is also connected to the fourth node N4, and unlike FIG. 1A, the control circuit 2 transmits the second clock signal to the third node Carry_Out under the control of the voltage at the fourth node N4 instead of the first node N1.

Figure 4:
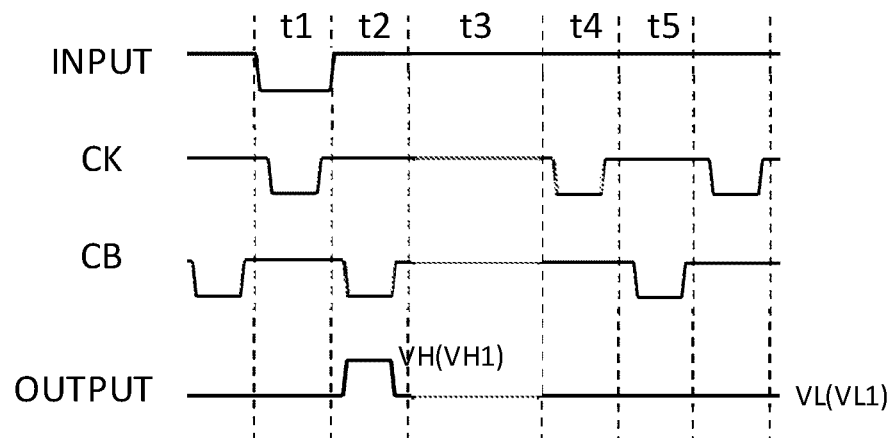
FIG. 4 is a timing diagram illustrating the operation of a shift register according to some embodiments of the present disclosure.

Since the pull-down control circuit 4 can control the level of the fifth node N5 regardless of the first clock signal CK, when the first clock signal CK and the second clock signal CB are simultaneously set to the inactive level after a signal of the inactive level is output through the signal output terminal OUTPUT (for example, in a period immediately following the period, such as the period t2 of FIG. 4, during which a signal of the inactive level is output through the signal output terminal OUTPUT), the pull-down control circuit 4 can provide the desired active level to the fifth node N5, thereby ensuring that a signal of the desired active level is output through the signal output terminal OUTPUT.

Figure 2:
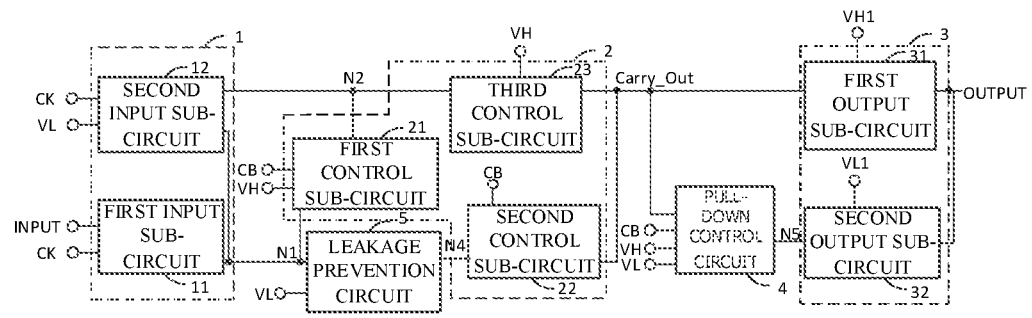
FIG. 2 is a block diagram of a shift register according to some embodiments of the present disclosure.

FIG. 2 is a block diagram of a shift register further illustrating the configuration of the shift register, according to some embodiments of the present disclosure.

Referring to FIG. 2, in some embodiments, the input circuit 1 may include a first input sub-circuit 11 and a second input sub-circuit 12. The first input sub-circuit 11 is connected to the signal input terminal INPUT, the first clock terminal CK and the first node N1, and is configured to transmit an input signal to the first node N1 under the control of a first clock signal. The second input sub-circuit 12 is connected to the first power supply terminal VL, the first clock terminal CK, the first node N1 and the second node N2, and is configured to transmit the first power supply signal to the second node N2 under control of the first clock signal, and to transmit the first clock signal to the second node N2 under control of a level at the first node N1.

In some embodiments, referring to FIG. 2, the control circuit 2 may include a first control sub-circuit 21, a second control sub-circuit 22 and a third control sub-circuit 23. The first control sub-circuit 21 is connected to the second node N2, the second clock terminal CB, the second power supply terminal VH and the first node N1, and is configured to transmit the second power supply signal to the first node N1 under the control of the level at the second node N2 and the second clock signal. The second control sub-circuit 22 is connected to the fourth node N4, the second clock terminal CB and the third node Carry_Out, and is configured to transmit the second clock signal to the third node Carry_Out under control of a level at the fourth node N4, and to maintain a voltage difference between the fourth node N4 and the third node Carry_Out when the fourth node N4 is floating. The third control sub-circuit 23 is connected to the second node N2, the second power supply terminal VH and the third node Carry_Out, and is configured to transmit the second power supply signal to the third node Carry_Out under control of the level at the second node N2, and to maintain the voltage difference between the second node N2 and the second power supply terminal VH when the second node N2 is floating.

In some embodiments, referring to FIG. 2, the output circuit 3 may include a first output sub-circuit 31 and a second output sub-circuit 32. The first output sub-circuit 31 is connected to the third node Carry_Out, the second power supply terminal VH and the signal output terminal OUTPUT, and is configured to transmit the fourth power supply signal to the signal output terminal OUTPUT under control of a level at the third node Carry_Out. The second output sub-circuit 32 is connected to the fifth node N5, the first power supply terminal VL and the signal output terminal OUTPUT, and is configured to transmit the third power supply signal to the signal output terminal OUTPUT under the control of the level at the fifth node N5.

It should be noted that although the connection relationship of the circuits in FIG. 2 corresponds to the shift register shown in FIG. 1B, the sub-circuits shown in FIG. 2 may be applied to the shift register shown in FIG. 1A, and in this case, the second control sub-circuit 22 is connected to the first node N1 (instead of the fourth node N4), the second clock terminal CB and the third node Carry_Out, and is configured to transmit the second clock signal to the third node Carry_Out under the control of the level at the first node N1, and to maintain the voltage difference between the first node N1 and the third node Carry_Out when the first node N1 is floating. The connection relationship and functions of other sub-circuits may refer to those described above.

Figure 3:
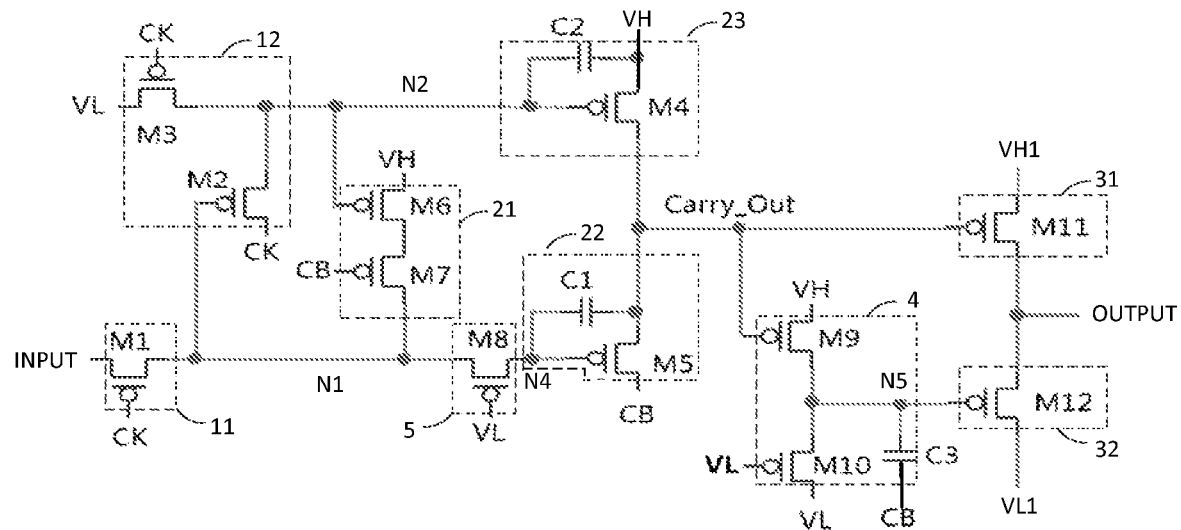
FIG. 3 is a circuit diagram of a shift register according to some embodiments of the present disclosure.

FIG. 3 illustrates a circuit diagram of a shift register according to some embodiments of the present disclosure.

In some embodiments, referring to FIG. 3, the pull-down control circuit 4 may include a first pull-down control transistor M9, a second pull-down control transistor M10 and a pull-down control capacitor C3. The first pull-down control transistor M9 has a control electrode connected to the third node Carry_Out, a first electrode connected to the second power supply terminal VH, and a second electrode connected to the fifth node N5. The second pull-down control transistor M10 has a control electrode connected to the first power supply terminal VL, a first electrode connected to the fifth node N5, and a second electrode connected to the first power supply terminal VL. The pull-down control capacitor C3 has a first electrode connected to the fifth node N5 and a second electrode connected to the second clock terminal CB.

The width-to-length ratios of the first pull-down control transistor M9 and the second pull-down control transistor M10 may be set such that the driving capability of the first pull-down control transistor M9 is greater than that of the second pull-down control transistor M10. Therefore, the capability of the pull-down control circuit 4 to drive the fifth node N5 through the second power supply terminal VH is greater than that of the pull-down control circuit 4 to drive the fifth node N5 through the first power supply terminal VL.

For example, when the first and second pull-down control transistors M9 and M10 are both transistors having the same conductivity type, the width-to-length ratio of the first pull-down control transistor M9 may be greater than that of the second pull-down control transistor M10. As one exemplary example, the width-to-length ratio of the first pull-down control transistor M9 may be 15 μm/5 μm, and the aspect ratio of the second pull-down control transistor M10 may be 7 μm/10 μm.

For example, referring to FIG. 3, when the first pull-down control transistor M9 and the second pull-down control transistor M10 are simultaneously turned on, since the driving capability of the first pull-down control transistor M9 is greater than that of the second pull-down control transistor M10, the pull-down control circuit 4 charges the fifth node N5 at a higher rate than the rate of discharging the fifth node N5, and the fifth node N5 is at a high level. When the first pull-down control transistor M9 is turned off and the second pull-down control transistor M10 is turned on, the fifth node N5 may be set to a low level by the second pull-down control transistor M10 until the level of the fifth node N5 is lowered to turn off the second pull-down control transistor M10. The pull-down control capacitor C3 may maintain a voltage difference between the fifth node N5 and the second clock terminal CB when the fifth node N5 is floating (i.e., both the first and second pull-down control transistors M9 and M10 are turned off), thereby maintaining a low level of the fifth node N5.

As such, the pull-down control circuit 4 may control the level of the fifth node N5 regardless of the first clock signal CK, and thus, when the first clock signal CK and the second clock signal CB are simultaneously set to the inactive level after a signal of the inactive level is output through the signal output terminal OUTPUT (for example, in a period immediately following the period, such as the period t2 of FIG. 4, during which a signal of the inactive level is output through the signal output terminal OUTPUT), the pull-down control circuit 4 can provide the desired active level to the fifth node N5, thereby ensuring that a signal of the desired active level is output through the signal output terminal OUTPUT.

With continued reference to FIG. 3, in some embodiments, the leakage prevention circuit 5 may include a leakage prevention transistor M8 having a control electrode connected to the first power supply terminal VL, a first electrode connected to the first node N1, and a second electrode connected to the fourth node N4.

The leakage prevention transistor M8 may be configured to prevent or reduce leakage of other circuit modules. For example, in the case where the active level is a low level, when the voltage at the fourth node N4 is too low, the leakage prevention transistor M8 is turned off, thereby electrically disconnecting the first node N1 from the fourth node N4. As such, the voltage at the first node N1 may not be too low, thereby alleviating leakage of other circuit blocks such as the input circuit 1.

With continued reference to FIG. 3, in some embodiments, the first control sub-circuit 21 may include a first control transistor M6 and a second control transistor M7. The first control transistor M6 has a control electrode connected to the second node N2, a first electrode connected to the second power supply terminal VH, and a second electrode connected to a first electrode of the second control transistor M7. A control electrode of the second control transistor M7 is connected to the second clock terminal CB, and a second electrode of the second control transistor M7 is connected to the first node N1.

In some embodiments, the second control sub-circuit 22 may include a third control transistor M5 and a first control capacitor C1. The third control transistor M5 has a control electrode connected to the fourth node N4, a first electrode connected to the third node Carry_Out, and a second electrode connected to the second clock terminal CB. The first control capacitor C1 has a first electrode connected to the fourth node N4, and a second electrode connected to the third node Carry_Out.

In some embodiments, the third control sub-circuit 23 may include a fourth control transistor M4 and a second control capacitor C2. The fourth control transistor M4 has a control electrode connected to the second node N2, a first electrode connected to the second power supply terminal VH, and a second electrode connected to the third node Carry_Out. The second control capacitor C2 has a first electrode connected to the second node N2, and a second electrode connected to the second power supply terminal VH.

In some embodiments, the first input sub-circuit 11 may include a first input transistor M1 having a control electrode connected to the first clock terminal CK, a first electrode connected to the signal input terminal INPUT, and a second electrode connected to the first node N1.

In some embodiments, the second input sub-circuit 12 includes a second input transistor M2 and a third input transistor M3. The second input transistor M2 has a control electrode connected to the first node N1, a first electrode connected to the second node N2, and a second electrode connected to the first clock terminal CK. The third input transistor M3 has a control electrode connected to the first clock terminal CK, a first electrode connected to the first power supply terminal VL, and a second electrode connected to the second node N2.

In some embodiments, the first output sub-circuit 31 includes a first output transistor M11 having a control electrode connected to the third node Carry_Out, a first electrode connected to the fourth power supply terminal VH1, and a second electrode connected to the signal output terminal OUTPUT.

In some embodiments, the second output sub-circuit 32 includes a second output transistor M12 having a control electrode connected to the fifth node N5, a first electrode connected to the signal output terminal OUTPUT, and a second electrode connected to the third power supply terminal VL 1.

It should be noted that, although the circuit diagram of FIG. 3 corresponds to the block diagrams shown in FIGS. 1B and 2, specific circuit elements shown in FIG. 3, other than the leakage prevention circuit 5, and the connection relationship thereof may be applied to the shift register shown in FIG. 1A, and in this case, the first node N1 and the fourth node N4 are one and the same node.

The operation process of the shift register according to the embodiment of the present disclosure is described below with reference to FIGS. 1B, 2, 3, and 4. It should be noted that the following descriptions of the operation process are explained by taking a case where all transistors are P-type transistors, the active level is a low level, and the inactive level is a high level as an example, but the present disclosure is not limited thereto.

In a first period t1, the input signal provided from the signal input terminal INPUT is at a low level, the first clock signal input from the first clock terminal CK is at a low level, and the second clock signal input from the second clock terminal CB is at a high level.

At this time, the input circuit 1 transmits the input signal to the first node N1, transmits the low-level power supply signal VL to the second node N2, and transmits the first clock signal to the second node N2. The control circuit 2 transmits the second clock signal to the third node Carry_Out, and transmits the high-level power supply signal VH to the third node Carry_Out. The pull-down control circuit 4 discharges the fifth node N5 to the low level. The output circuit 3 transmits the low-level power supply signal VL1 to the signal output terminal OUTPUT. The leakage prevention circuit 5 electrically connects the first node N1 and the fourth node N4.

Specifically, referring to FIGS. 3 and 4, the first input transistor M1 is turned on, the first node N1 is at a low level, the second input transistor M2 and the third input transistor M3 are turned on, and the second node N2 is at a low level. Under the control of the first power supply signal provided from the first power supply terminal VL, the leakage prevention transistor M8 is turned on, and the fourth node N4 is at a low level. The third control transistor M5 is turned on in response to the low level of the fourth node N4, and the fourth control transistor M4 is turned on in response to the low level of the second node N2, so that the third node Carry_Out is at a high level. In response to the high level of the third node Carry_Out, the first pull-down control transistor M9 and the first output transistor M11 are turned off. The second pull-down control transistor M10 is turned on under the control of the first power supply signal provided from the first power supply terminal VL, until the fifth node N5 is pulled down to be at a low level. In response to the low level of the fifth node N5, the second output transistor M12 is turned on, so that the signal output from the signal output terminal OUTPUT is at a low level.

In a second period t2, the input signal provided from the signal input terminal INPUT is at a high level, the first clock signal input from the first clock terminal CK is at a high level, and the second clock signal input from the second clock terminal CB is at a low level.

At this time, the input circuit 1 transmits the first clock signal to the second node N2. The control circuit 2 transmits the second clock signal to the third node Carry_Out. The pull-down control circuit 4 charges the fifth node N5 to be at a high level under the control of the level at the third node Carry_Out. The output circuit 3 transmits the high-level power supply signal VH1 to the signal output terminal OUTPUT. The leakage prevention circuit electrically disconnects the first node N1 and the fourth node N4.

Specifically, referring to FIGS. 3 and 4, the first input transistor M1 and the third input transistor M3 are turned off. Due to the holding function of the first control capacitor C1, the third control transistor M5 is kept on under the control of the level of the fourth node N4, and the second clock signal CB having a low level is transmitted to the third node Carry_Out through the third control transistor M5, so that the third node Carry_Out is at a low level. At this time, the level of the fourth node N4 becomes a lower level than that in the first period t1 by the coupling effect of the first control capacitor C1, so that the leakage preventing transistor M8 is turned off. As such, the low level at the fourth node N4, that is lower than that in the first period t1, is not transmitted to the first node N1. In response to the low voltage of the first node N1, the second input transistor M2 is turned on, so that the second node N2 is at a high level, and thus the fourth control transistor M4 is turned off. In response to the low level of the third node Carry_Out, the first pull-down control transistor M9 is turned on, and meanwhile, since the driving capability of the first pull-down control transistor M9 is greater than that of the second pull-down control transistor M10, the fifth node N5 is at a high level. In response to a high level of the fifth node N5, the second output transistor M12 is turned off, and in response to the low level of the third node Carry_Out, the first output transistor M11 is turned on, so that a signal output from the signal output terminal OUTPUT is at a high level.

In a third period t3, the input signal provided from the signal input terminal INPUT is at a high level, the first clock signal input from the first clock terminal CK is at a high level, and the second clock signal input from the second clock terminal CB is at a high level.

At this time, the input circuit 1 transmits the first clock signal to the second node N2. The control circuit 2 transmits the second clock signal to the third node Carry_Out. The pull-down control circuit 4 discharges the fifth node N5 to be at the low level. The output circuit 3 transmits the low-level power supply signal VL1 to the signal output terminal OUTPUT.

Specifically, the first input transistor M1 and the third input transistor M3 remain off, the first node N1 maintains the low level of the previous stage, the second node N2 maintains the high level of the previous stage, the fourth control transistor M4 remains off, and the third control transistor M5 remains on. The high-level input from the second clock terminal CB is transmitted to the third node Carry_Out through the third control transistor M5, so that the first pull-down control transistor M9 is turned off. The second pull-down control transistor M10 is turned on under the control of the first power supply signal provided from the first power supply terminal VL, until the fifth node N5 is pulled down to be at a low level. In response to the low level of the fifth node N5, the second output transistor M12 is turned on, and in response to the high level of the third node Carry_Out, the first output transistor M11 is turned off, so that the signal output from the signal output terminal OUTPUT is at a low level.

In a fourth period t4, the input signal provided from the signal input terminal INPUT is at a high level, the first clock signal input from the first clock terminal CK is at a low level, and the second clock signal input from the second clock terminal CB is at a high level.

At this time, the input circuit 1 transmits the input signal to the first node N1, and transmits the low-level power supply signal VL to the second node N2. The control circuit 2 transmits the high-level power supply signal VH to the third node Carry_Out. The pull-down control circuit 4 maintains the low level of the fifth node N5. The output circuit 3 transmits the low-level power supply signal VL1 to the signal output terminal OUTPUT. The leakage prevention circuit 5 electrically connects the first node N1 and the fourth node N4.

Specifically, the first input transistor M1 is turned on, and the first node N1 is at a high level, so that the second input transistor M2 is turned off; the third input transistor M3 is turned on, and the second node N2 is at a low level. In response to the low level of the second node N2, the fourth control transistor M4 is turned on, so that the third node Carry_Out is at a high level. Under the control of the first power supply signal provided from the first power supply terminal VL, the leakage prevention transistor M8 is turned on, so that the fourth node N4 is at a high level. In response to the high level of the fourth node N4, the third control transistor M5 is turned off. In response to the high level of the third node Carry_Out, the first pull-down control transistor M9 and the first output transistor M11 are turned off. Under the holding function of the pull-down control capacitor C3, the fifth node N5 is at a low level. In response to the low level of the fifth node N5, the second output transistor M12 is turned on, so that the signal output from the signal output terminal OUTPUT is at a low level.

In a fifth period t5, the input signal provided from the signal input terminal INPUT is at a high level, the first clock signal input from the first clock terminal CK is at a high level, and the second clock signal input from the second clock terminal CB is at a low level.

At this time, the control circuit 2 transmits the high-level power supply signal VH to the third node Carry_Out, and transmits the high-level power supply signal VH to the first node N1. The pull-down control circuit 4 controls the fifth node N5 to be at a low level. The output circuit 3 transmits the low-level power supply signal VL1 to the signal output terminal OUTPUT. The leakage prevention circuit 5 electrically connects the first node N1 and the fourth node N4.

Specifically, the first input transistor M1 and the third input transistor M3 are turned off. The second node N2 maintains a low level, the first control transistor M6 maintains on, and the second control transistor M7 is turned on in response to the low level of the second clock terminal CB, so that the first node N1 is at a high level. Under the control of the first power supply signal provided from the first power supply terminal VL, the leakage prevention transistor M8 is turned on, so that the fourth node N4 is at a high level. In response to the high level of the fourth node N4, the third control transistor M5 is turned off. Since the second node N2 is at a low level, the fourth control transistor M4 is turned on, and the third node Carry_Out is at a high level. In response to the high level of the third node Carry_Out, the first pull-down control transistor M9 and the first output transistor M11 are turned off. The level of fifth node N5 becomes a lower level than that in the fourth period t4 by the coupling effect of the pull-down control capacitor C3, and the second pull-down control transistor M10 is turned off. In response to the low level of the fifth node N5, the second output transistor M12 is turned on, so that the signal output from the signal output terminal OUTPUT is at a low level.

Thereafter, the fourth period t4 and the fifth period t5 are repeated until the next third period t3 is performed in response to an external signal (for example, an external signal for setting the clock signals CK and CB to be at an inactive level), and then the fourth period t4 and the fifth period t5 are continued to be repeated; and/or a next first period t1 occurs in response to a change in the input signal (e.g., a next active level pulse of the input signal).

In the shift register according to the embodiment of the present disclosure, by using the pull-down control circuit 4 described above, the level of the fifth node N5 can be controlled regardless of the first clock signal CK, so that the signal output terminal OUTPUT can still output a desired level (e.g., an active level) when the first clock signal CK and the second clock signal CB are simultaneously set to an inactive level. When such the shift register is employed to constitute an Emission GOA, the pulse widths of the light-emitting control signals of different pixel rows are the same, so that normal display is ensured. In addition, when the shift register further includes the leakage prevention circuit 5, leakage can be reduced, thereby reducing power consumption and ensuring display quality.

Figure 7:
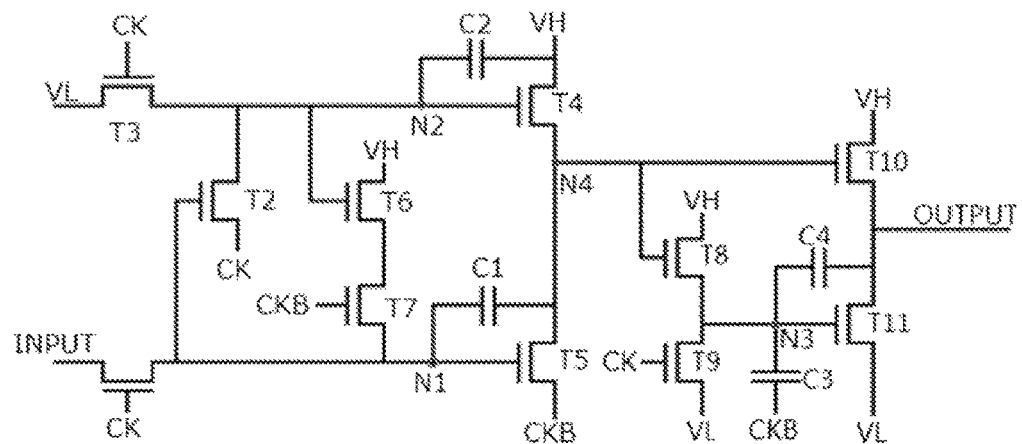
FIG. 7 is a circuit diagram of a shift register according to a comparative example.
Figure 8:
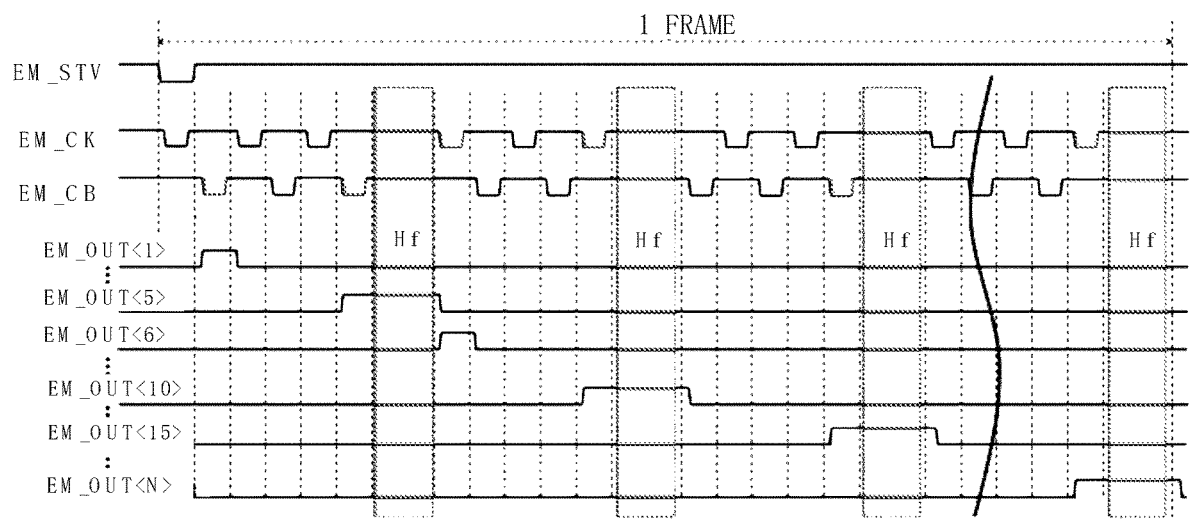
FIG. 8 is a timing diagram of a gate driver to which a shift register according to a comparative example is applied.

Referring now to FIGS. 7 and 8, the shift register according to some embodiments of the present disclosure is compared with a comparative example. FIG. 7 shows a shift register according to a comparative example, and FIG. 8 is a timing diagram of Emission GOA to which the shift register shown in FIG. 7 is applied. As an example of the comparative example, all the transistors in FIG. 7 are P-type transistors.

Referring to FIGS. 7 and 8, the control electrode of the transistor T10 is connected to the first clock terminal CK, and the driving of the fifth node is directly related to the first clock signal CK. As shown in FIG. 8, the clock signals of the first clock terminal CK and the second clock terminal CB are both at high level in the input period of the Hf signal, and the shift register of fifth stage of the Emission GOA outputs a high-level pulse through its output terminal immediately before the input period of the Hf signal. In this case, referring to the shift register circuit shown in FIG. 7, the node N4 is set to be at a high level via the transistor T5, the transistor T9 is turned off under the control of the high level of the clock signal CK, so that it maintains a high level output at the output terminal OUTPUT of the shift register due to the capacitors C3 and C4, but a desired low level signal cannot be output through the output terminal OUTPUT of the shift register. Further, due to the presence of the capacitor C4, the node N3 is affected by both the clock signal CB and the output signal OUTPUT, and once the clock signals CK and CB cannot normally operate alternately, the node N3 cannot become a low level for a period in which the output terminal OUTPUT is expected to output a low-level signal.

However, referring to FIGS. 1A to 4 and the above description, in the shift register according to the embodiment of the present disclosure, by making the pull-down control circuit 4 control the level of the fifth node N5 regardless of the first clock signal CK, when the signals of the first clock terminal CK and the second clock terminal CB are both at high level after the output terminal outputs the high level pulse, the signal output terminal OUTPUT of the shift register may output a low level signal as desired. As such, when the shift register is applied to the Emission GOA, the pulse widths of the light emission control signals of different pixel rows are the same, thereby ensuring normal display.

Further, referring to FIGS. 7 and 8, in a period in which the output terminal OUTPUT of the shift register outputs a high-level pulse, the first node N1 may be set to a lower level due to a coupling effect of the capacitor, which may cause leakage of other circuit components such as the transistor T1. However, referring to FIGS. 1B to 4 and the above description, in the shift register according to the embodiment of the present disclosure, by providing the leakage prevention circuit 5, the level of the first node N1 is prevented from becoming lower, thereby preventing or reducing leakage of other circuit components.

In another aspect, the present disclosure provides a gate driver, including a plurality of cascaded shift registers, where the shift register is any one of the shift registers described above.

Figure 5:
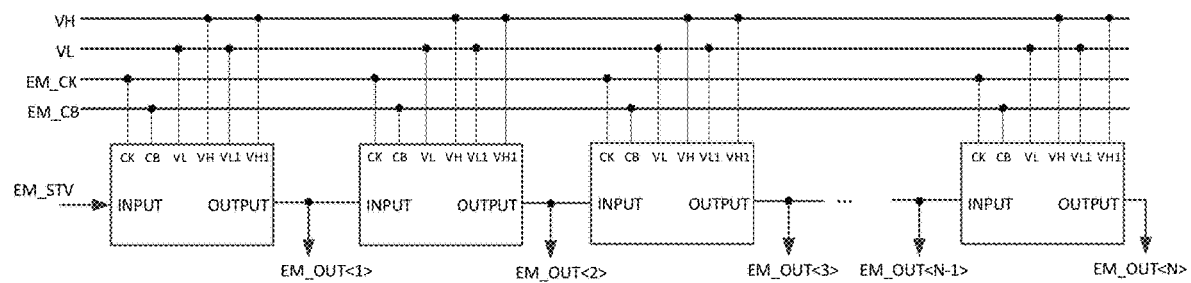
FIG. 5 is a block diagram of a gate driver according to some embodiments of the present disclosure.
Figure 6:
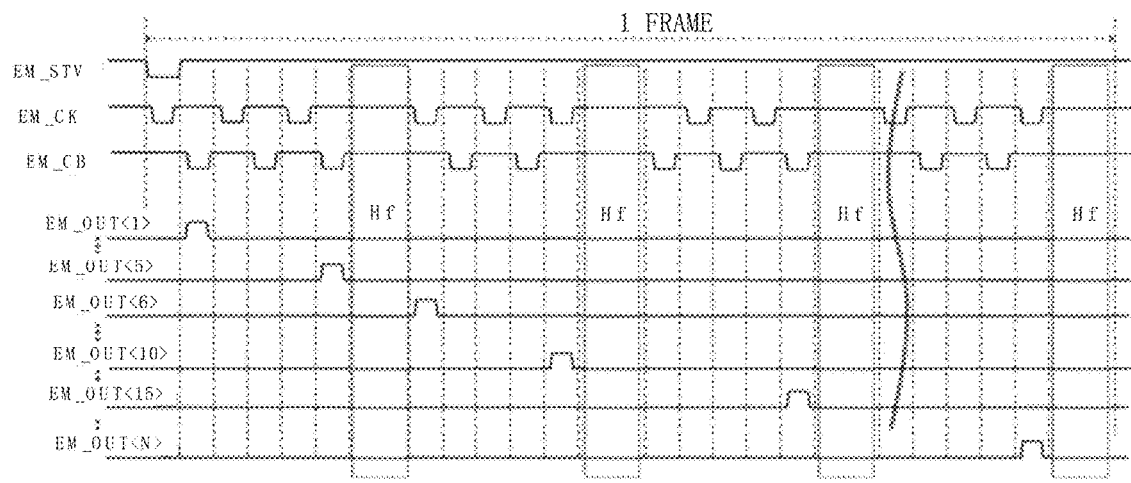
FIG. 6 is a timing diagram illustrating the operation of a gate driver according to some embodiments of the present disclosure.

For example, referring to FIG. 5, the gate driver includes N cascaded shift registers. The signal input terminal of the shift register at a first stage is applied with a scanning start signal EM_STV (refer to FIG. 6), the signal input terminal of the shift register at an i-th stage is connected to the signal output terminal of the shift register at an (i−1)th stage (2≤i≤N), and the shift registers at the respective stages output signals EM_OUT<1> to EM_OUT<N> of their own stages, respectively. For example, when the gate driver is an Emission GOA, the shift registers at each stages output a light emission control signal for a corresponding pixel row. The first clock terminal CK and the second clock terminal CB of the shift registers at the respective stages are alternately connected to the first clock signal line EM_CK and the second clock signal line EM_CB, respectively. For example, referring to FIG. 5, the first clock terminals CK of the shift registers at the odd-numbered stages are connected to the first clock signal line EM_CK, and the second clock terminals CB of the shift registers at the odd-numbered stages are connected to the second clock signal line EM_CB; the first clock terminals CK of the shift registers at the even-numbered stages are connected to the second clock signal line EM_CB, and the second clock terminals CB of the shift registers at the even-numbered stages are connected to the first clock signal line EM_CK. FIG. 6 illustrates operation timings of the gate driver illustrated in FIG. 5, where the Hf period indicates a period in which both the first and second GOA clock signals EM_CK and EM_CB are at an inactive level. For example, when the gate driver is an emission GOA and a high frequency PWM signal is applied for light emission time control, the Hf period indicates a period in which the high frequency PWM signal is input. In addition, all shift registers of the gate driver operate in response to the same group of clock signals. For example, when the gate driver is the Emission GOA, all the shift registers operate in response to the same group of clock signals, and levels of the group of clock signals become inactive levels in response to the same high frequency PWM signal, and thus, a period (i.e., the period t3 described above) in which both the first clock signal CK and the second clock signal CB of the shift registers are at inactive levels is not the same for each shift register.

In the gate driver according to the embodiment of the present disclosure, since each shift register includes the pull-down control circuit as described above, even if the light emission control is performed by applying the high-frequency PWM signal, the pulse widths of the light emission control signals of different pixel rows are the same, thereby ensuring normal display.

In another aspect, the present disclosure provides a display device including the above gate driver.

In some embodiments, the display device may be a micro LED display device.

For example, the display device may be any product or component having a display function, such as a display, a mobile phone, a tablet computer, a television, a notebook computer, a digital photo frame, and a navigator or the like.

In another aspect, the present disclosure provides a method for driving the shift register. The method includes: in a first period, applying an input signal having an active level to the signal input terminal, applying a first clock signal having an active level to the first clock terminal, and applying a second clock signal having an inactive level to the second clock terminal, such that a signal output from the output terminal of the shift register has a first level; in a second period, applying the input signal having an inactive level to the signal input terminal, applying the first clock signal having an inactive level to the first clock terminal, and applying the second clock signal having an active level to the second clock terminal, such that the signal output from the output terminal of the shift register has a second level different from the first level; in a third period, applying the input signal having an inactive level to the signal input terminal, applying the first clock signal having an inactive level to the first clock terminal, and applying the second clock signal having an inactive level to the second clock terminal, such that the signal output from the output terminal of the shift register has the first level; in a fourth period, applying the input signal having an inactive level to the signal input terminal, applying the first clock signal having an active level to the first clock terminal, and applying the second clock signal having an inactive level to the second clock terminal, such that the signal output from the output terminal of the shift register has the first level; and in a fifth period, applying the input signal having an inactive level to the signal input terminal, applying the first clock signal having an inactive level to the first clock terminal, and applying the second clock signal having an active level to the second clock terminal, such that a signal output from the output terminal of the shift register has the first level. The first period, the second period, the third period, the fourth period, and the fifth period are periods that are sequential in time. During the first through fifth periods, a first power supply signal having a constant inactive level is applied to the first power supply terminal, a second power supply signal having a constant active level is applied to the second power supply terminal, a third power supply signal having a constant first level is applied to the third power supply terminal, and a fourth power supply signal having a constant second level is applied to the fourth power supply terminal.

For example, referring to FIG. 4, the first to fifth periods described above are the periods t1 to t5 shown in FIG. 4, the first clock signal is the signal CK shown in FIG. 4, the second clock signal is the signal CB shown in FIG. 4, the input signal is the signal INPUT shown in FIG. 4, and the signal output from the output terminal of the shift register is the signal OUTPUT shown in FIG. 4. The first level of the output signal of the shift register is a high level, and the second level thereof is a low level.

According to the method of driving the above-described shift register of the present disclosure, the shift register outputs the high-level pulse in the second period t2, and outputs the low-level pulse in the third period t3 in which both the first clock signal and the second clock signal are at the inactive level. As such, when the method of driving the shift register is applied to the Emission GOA, the pulse widths of the light emitting control signals of different pixel rows are the same, thereby ensuring normal display.

It will be understood that the above embodiments are merely exemplary embodiments used to illustrate the principles of the present disclosure, and the present disclosure is not limited thereto. It will be apparent to those skilled in the art that various changes and modifications can be made therein without departing from the spirit and essential of the present disclosure, and these changes and modifications are to be considered within the scope of protection of the present disclosure.

What is claimed is:

1. A shift register, comprising:
an input circuit coupled to a signal input terminal, a first clock terminal, a first power supply terminal, a first node and a second node, and configured to transmit an input signal provided from the signal input terminal to the first node under control of a first clock signal input from the first clock terminal, to transmit a first power supply signal provided from the first power supply terminal to the second node under control of the first clock signal, and to transmit the first clock signal to the second node under control of a level at the first node;
a control circuit coupled to the first node, the second node, a second power supply terminal, a second clock terminal, a third node and a fourth node, and configured to transmit a second power supply signal provided from the second power supply terminal to the first node under control of a level at the second node and a second clock signal input from the second clock terminal, to transmit the second clock signal to the third node under control of at least one of a level at the fourth node and the level at the first node, and to transmit the second power supply signal to the third node under control of the level at the second node;
a pull-down control circuit coupled to the second clock terminal, the first power supply terminal, the second power supply terminal, the third node and a fifth node;
an output circuit coupled to the third node, a third power supply terminal, a fourth power supply terminal, the fifth node and a signal output terminal, and configured to transmit a fourth power supply signal provided from the fourth power supply terminal to the signal output terminal under control of a level at the third node, and to transmit a third power supply signal provided from the third power supply terminal to the signal output terminal under control of a level at the fifth node, the third power supply signal and the first power supply signal being same, and the second power supply signal and the fourth power supply signal being same; and
a leakage prevention circuit coupled to the first node, the first power supply terminal and the fourth node, and configured to control an electrical connection between the first node and the fourth node under control of the first power supply signal,
wherein the pull-down control circuit comprises: a first pull-down control transistor, a second pull-down control transistor, and a pull-down control capacitor, the first pull-down control transistor has a control electrode coupled to the third node, a first electrode coupled to the second power supply terminal, and a second electrode coupled to the fifth node, and the pull-down control capacitor has a first electrode coupled to the fifth node, and a second electrode coupled to the second clock terminal, the level at the fifth node is controlled only by the first pull-down control transistor, the second pull-down control transistor and the pull-down control capacitor without any capacitive element coupled between the fifth node and the signal output terminal, and
wherein the second pull-down control transistor has a control electrode coupled to the first power supply terminal, a first electrode coupled to the fifth node, and a second electrode coupled to the first power supply terminal while the first pull-down control transistor has a larger width-to-length channel ratio than that of the second pull-down control transistor, such that the level at the fifth node is controlled independently of the first clock signal in a case where the first clock signal and the second clock signal are simultaneously set to an inactive level;
the output circuit comprises a second output sub-circuit, which comprises a second output transistor having a control electrode coupled to the fifth node, a second electrode coupled to the third power supply terminal and a first electrode coupled to the signal output terminal, and configured to transmit the third power supply signal to the signal output terminal under control of the level at the fifth node.

2. The shift register of claim 1, wherein the control circuit is configured to transmit the second clock signal to the third node under control of the level at the fourth node.

3. The shift register of claim 2, wherein the leakage prevention circuit comprises a leakage prevention transistor, the leakage prevention transistor has a control electrode coupled to the first power supply terminal, a first electrode coupled to the first node, and a second electrode coupled to the fourth node.

4. The shift register of claim 1, wherein the control circuit is configured to transmit the second clock signal to the third node under control of the level at the fourth node, and comprises:
- a first control sub-circuit coupled to the second node, the second clock terminal, the second power supply terminal and the first node, and configured to transmit the second power supply signal to the first node under control of the level at the second node and the second clock signal,
- a second control sub-circuit coupled to the fourth node, the second clock terminal and the third node, and configured to transmit the second clock signal to the third node under control of the level at the fourth node, and to maintain a voltage difference between the fourth node and the third node in a case where the fourth node is floating, and
- a third control sub-circuit coupled to the second node, the second power supply terminal and the third node, and configured to transmit the second power supply signal to the third node under control of the level at the second node, and to maintain a voltage difference between the second node and the second power supply terminal in a case where the second node is floating.

5. The shift register of claim 4, wherein the first control sub-circuit comprises a first control transistor and a second control transistor,
- the first control transistor has a control electrode coupled to the second node, a first electrode coupled to the second power supply terminal, and a second electrode coupled to a first electrode of the second control transistor, and
- a control electrode of the second control transistor is coupled to the second clock terminal, and a second electrode of the second control transistor is coupled to the first node.

6. The shift register of claim 4, wherein the second control sub-circuit comprises a third control transistor and a first control capacitor,
- the third control transistor has a control electrode coupled to the fourth node, a first electrode coupled to the third node, and a second electrode coupled to the second clock terminal, and
- the first control capacitor has a first electrode coupled to the fourth node and a second electrode coupled to the third node.

7. The shift register according to claim 4, wherein the third control sub-circuit comprises a fourth control transistor and a second control capacitor,
- the fourth control transistor has a control electrode coupled to the second node, a first electrode coupled to the second power supply terminal, and a second electrode coupled to the third node, and
- the first control capacitor has a first electrode coupled to the second node, and a second electrode coupled to the second power supply terminal.

8. The shift register of claim 1, wherein the input circuit comprises:
- a first input sub-circuit coupled to the signal input, the first clock terminal and the first node, and configured to transmit the input signal to the first node under control of the first clock signal, and
- a second input sub-circuit coupled to the first power supply terminal, the first clock terminal, the first node and the second node, and configured to transmit the first power supply signal to the second node under control of the first clock signal, and to transmit the first clock signal to the second node under control of the level at the first node.

9. The shift register of claim 8, wherein the first input sub-circuit comprises a first input transistor,
- the first input transistor has a control electrode coupled to the first clock terminal, a first electrode coupled to the signal input terminal, and a second electrode coupled to the first node.

10. The shift register of claim 8, wherein the second input sub-circuit comprises a second input transistor and a third input transistor,
- the second input transistor has a control electrode coupled to the first node, a first electrode coupled to the second node, and a second electrode coupled to the first clock terminal, and
- the third input transistor has a control electrode coupled to the first clock terminal, a first electrode coupled to the first power supply terminal, and a second electrode coupled to the second node.

11. The shift register of claim 1, wherein the output circuit further comprises:
- a first output sub-circuit coupled to the third node, the fourth power supply terminal and the signal output terminal, and configured to transmit the fourth power supply signal to the signal output terminal under control of the level at the third node.

12. The shift register of claim 11, wherein the first output sub-circuit comprises a first output transistor,
- the first output transistor has a control electrode coupled to the third node, a first electrode coupled to the fourth power supply terminal, and a second electrode coupled to the signal output terminal.

13. A gate driver, comprising a plurality of cascaded shift registers, each shift register being the shift register of claim 1.

14. A display device, comprising the gate driver of claim 13.

15. A method for driving a shift register, the shift register being the shift register of claim 1, the method comprising:
- in a first period, applying the input signal having an active level to the signal input terminal, applying the first clock signal having an active level to the first clock terminal, and applying the second clock signal having an inactive level to the second clock terminal, such that a signal output from the output terminal of the shift register has a first level;
- in a second period, applying the input signal having an inactive level to the signal input terminal, the first clock signal having an inactive level to the first clock terminal, and the second clock signal having an active level to the second clock terminal, such that the signal output from the output terminal of the shift register has a second level different from the first level;
- in a third period, applying the input signal having an inactive level to the signal input terminal, applying the first clock signal having an inactive level to the first clock terminal, and applying the second clock signal having an inactive level to the second clock terminal, such that a signal output from the output terminal of the shift register has the first level;
- in a fourth period, applying the input signal having an inactive level to the signal input terminal, applying the first clock signal having an active level to the first clock terminal, and applying the second clock signal having an inactive level to the second clock terminal, such that a signal output from the output terminal of the shift register has the first level; and in a fifth period, applying the input signal having an inactive level to the signal input terminal, applying the first clock signal having an inactive level to the first clock terminal, applying the second clock signal having an active level to the second clock terminal, such that a signal output from the output terminal of the shift register has the first level, wherein the first period, the second period, the third period, the fourth period, and the fifth period are periods that are sequential in time, and during the first through fifth periods, the first power supply signal constantly having the first level is applied to the first and third power supply terminals, the second power supply signal constantly having the second level is applied to the second and fourth power supply terminals.

* * * * *